(12) United States Patent
Lee et al.

(10) Patent No.: US 7,126,824 B2
(45) Date of Patent: Oct. 24, 2006

(54) HEAT DISSIPATION DEVICE ASSEMBLY INCORPORATING RETENTION MEMBER

(75) Inventors: Hsieh Kun Lee, Tu-Chen (TW); Wanlin Xia, Shenzhen (CN); Jin Song Feng, Shenzhen (CN)

(73) Assignees: Fu Zhun Precision Industrial (Shenzhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 142 days.

(21) Appl. No.: 10/900,716

(22) Filed: Jul. 27, 2004

(65) Prior Publication Data
US 2005/0094379 A1 May 5, 2005

(30) Foreign Application Priority Data
Oct. 31, 2003 (TW) .............................. 92219408 U

(51) Int. Cl.
*H05K 7/20* (2006.01)

(52) U.S. Cl. ...................... 361/704; 361/695; 361/719; 257/706; 257/712; 257/718; 174/16.1; 174/16.3; 165/80.3; 165/122; 165/185

(58) Field of Classification Search ...................... None
See application file for complete search history.

(56) References Cited

U.S. PATENT DOCUMENTS 6,097,601 A * 8/2000 Lee ............................. 361/704
6,141,220 A * 10/2000 Lin ............................. 361/704
6,307,747 B1 * 10/2001 Farnsworth et al. ........ 361/704
6,449,154 B1 * 9/2002 Yoneyama et al. ......... 361/704
6,473,306 B1   10/2002 Koseki et al.
6,646,881 B1 * 11/2003 Lai et al. .................... 361/719
6,724,632 B1 * 4/2004 Lee et al. .................... 361/719
6,778,396 B1 * 8/2004 Liu ............................. 361/719

FOREIGN PATENT DOCUMENTS

| TW | 413350 | 11/2000 |
|----|--------|---------|
| TW | 423674 | 2/2001  |

* cited by examiner

Primary Examiner—Boris Chervinsky
(74) Attorney, Agent, or Firm—Wei Te Chung

(57) ABSTRACT

A heat dissipation device assembly includes a heat sink (20) placed on an electronic component (52) which is mounted on a printed circuit board (PCB) (50) and including a pair of shoulders (23) on opposite sides thereof, a pressing part (30) including a pair of pressing portions (36) supported on the shoulders and a pair of locking portions (34) spaced from the shoulders, a sliding part (40) slidably attached to the pressing part and including a pair of locking portions (41) spaced from the shoulder, and a back plate (60) mounted below the PCB and including four posts (61) extending through the PCB and the heat sink to resiliently engage with the locking portions. Each locking portion defines a locking opening (33, 43) including an entrance (33a, 43a) and a locking slot (33b, 43b), the post being capable of extending through the entrance to engage in the locking slot.

16 Claims, 4 Drawing Sheets

HEAT DISSIPATION DEVICE ASSEMBLY INCORPORATING RETENTION MEMBER

BACKGROUND OF THE INVENTION

1. Field of the Invention

The present invention relates to a heat dissipation device assembly, and particularly to a heat dissipation device assembly incorporating a retention member which can readily and conveniently mount a heat sink to an electronic component.

2. Prior Art

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the generated heat quickly, for example by using a heat sink attached to the CPU in the enclosure. This allows the CPU and other electronic components in the enclosure to function within their normal operating temperature ranges, thereby assuring the quality of data management, storage and transfer. Oftentimes, a clip is required for mounting the heat sink to the CPU.

A wide variety of heat dissipation devices and clips are available in the prior art. FIG. 4 shows a conventional clip 3 mounting a heat sink 1 to a socket 6 on which a CPU is mounted. The heat sink 1 defines a channel 2 for extension of the clip 3 therethrough. The clip 3 is M-shaped and comprises a pair of legs 4. Each leg 4 defines a locking opening 5 engaging with a corresponding protrusion 7 of the socket 6. In disassembly, a tool 8 is required to disengage the locking openings 5 of the clip 3 from the protrusions 7 of the socket 6. However, since space in a computer is limited operation of the tool 8 is adversely limited by other electronic elements. Furthermore, when over force is applied on the tool 8 the tool 8 is easy to slide away from the clip 3. It is prone to damage the CPU and other electronic elements in the computer. It is inconvenient to use the tool 8.

SUMMARY OF THE INVENTION

Accordingly, an object of the present invention is to provide a heat dissipation device assembly incorporating a retention member which can readily and conveniently mount a heat sink to an electronic component.

Another object of the present invention is to provide a heat dissipation device assembly incorporating a retention member which occupies a small space.

To achieve the above-mentioned objects, a heat dissipation device in accordance with a first preferred embodiment of the present invention comprises a heat sink placed on an electronic component which is mounted on a printed circuit board and having a pair of shoulders on opposite sides thereof, a pressing part including a pair of pressing portions supported on the shoulders of the heat sink and a pair of locking portions spaced from the shoulders, a sliding part slidably attached to the pressing member and including a pair of locking portions spaced from the shoulder, and a back plate mounted below the printed circuit board and including two pairs of posts extending through the printed circuit board and the heat sink to resiliently engage with the locking portions. Each locking portion defines a locking opening comprising an entrance and a locking slot, the post being capable of extending through the entrance to engage in the locking slot of a corresponding locking opening.

Other objects, advantages and novel features of the present invention will be drawn from the following detailed description of a preferred embodiment of the present invention with attached drawings, in which:

DETAILED DESCRIPTION OF THE INVENTION

Figure 1:
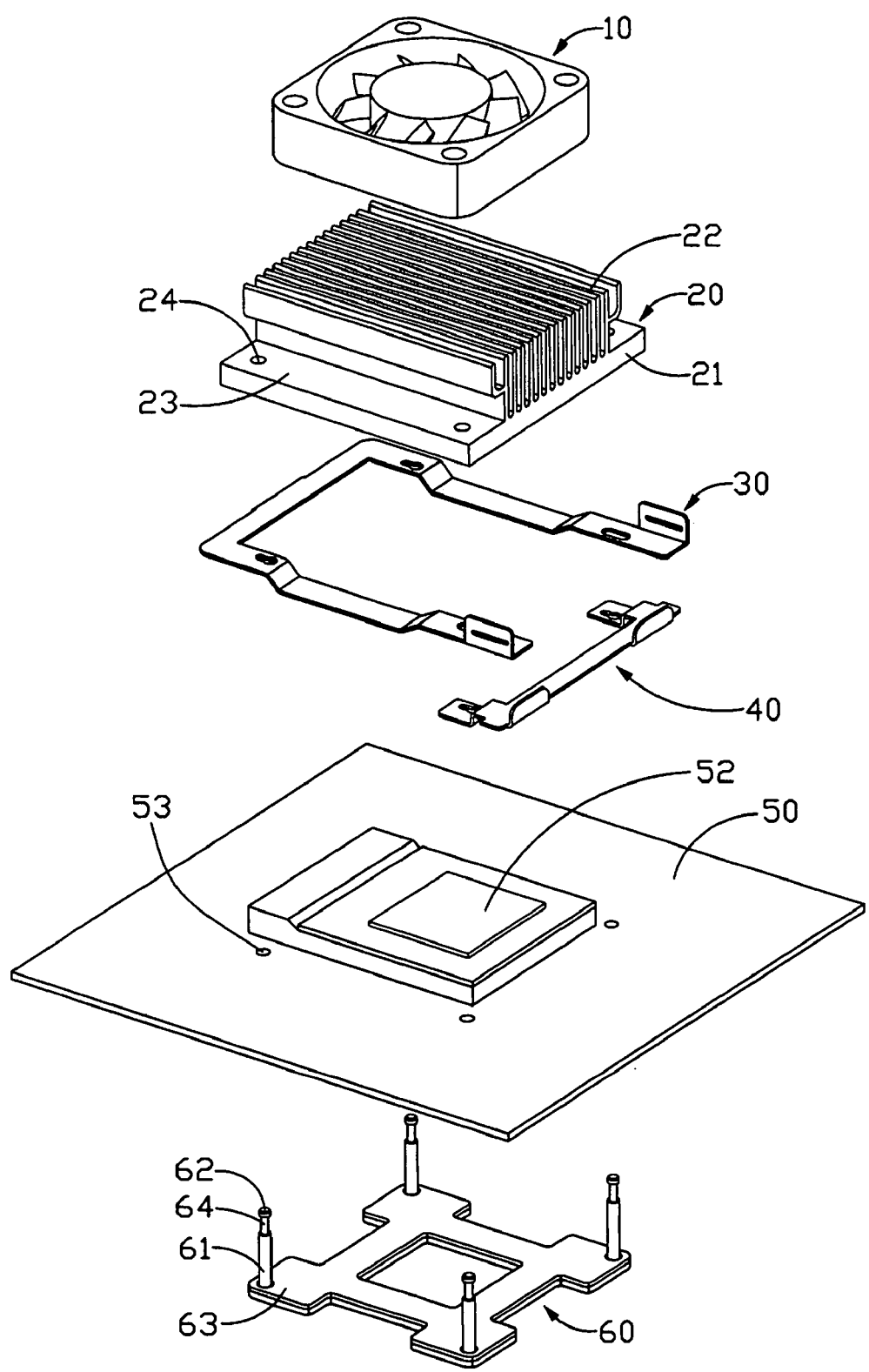
FIG. 1 is an exploded, isometric view of a heat dissipation device assembly in accordance with a preferred embodiment of the present invention, together with a printed circuit board on which an electronic component is mounted.

FIG. 1 shows a heat dissipation device assembly in accordance with a preferred embodiment of the present invention, and a printed circuit board (PCB) 50 on which an electronic component 52 such as a central processing unit is mounted. The PCB 50 defines two pairs of through apertures 53 around the electronic component 52. The heat dissipation device assembly comprises a fan 10, a heat sink 20, a retention member, and a back plate 60. The retention member comprises a pressing part 30 and a sliding part 40.

The heat sink 20 comprises a base 21 and a plurality of fins 22 extending from the base 21. A pair of shoulders 23 is formed on the base 21 on opposite sides of the fins 22. Each shoulder 23 defines a pair of through apertures 24 therein.

The back plate 60 comprises a body 63 and two pairs of posts 61 extending from the body 63. The body 63 defines an opening (not labeled) in a center thereof. Each post 61 comprises a head 62 and a neck 64 below the head 62.

Figure 2:
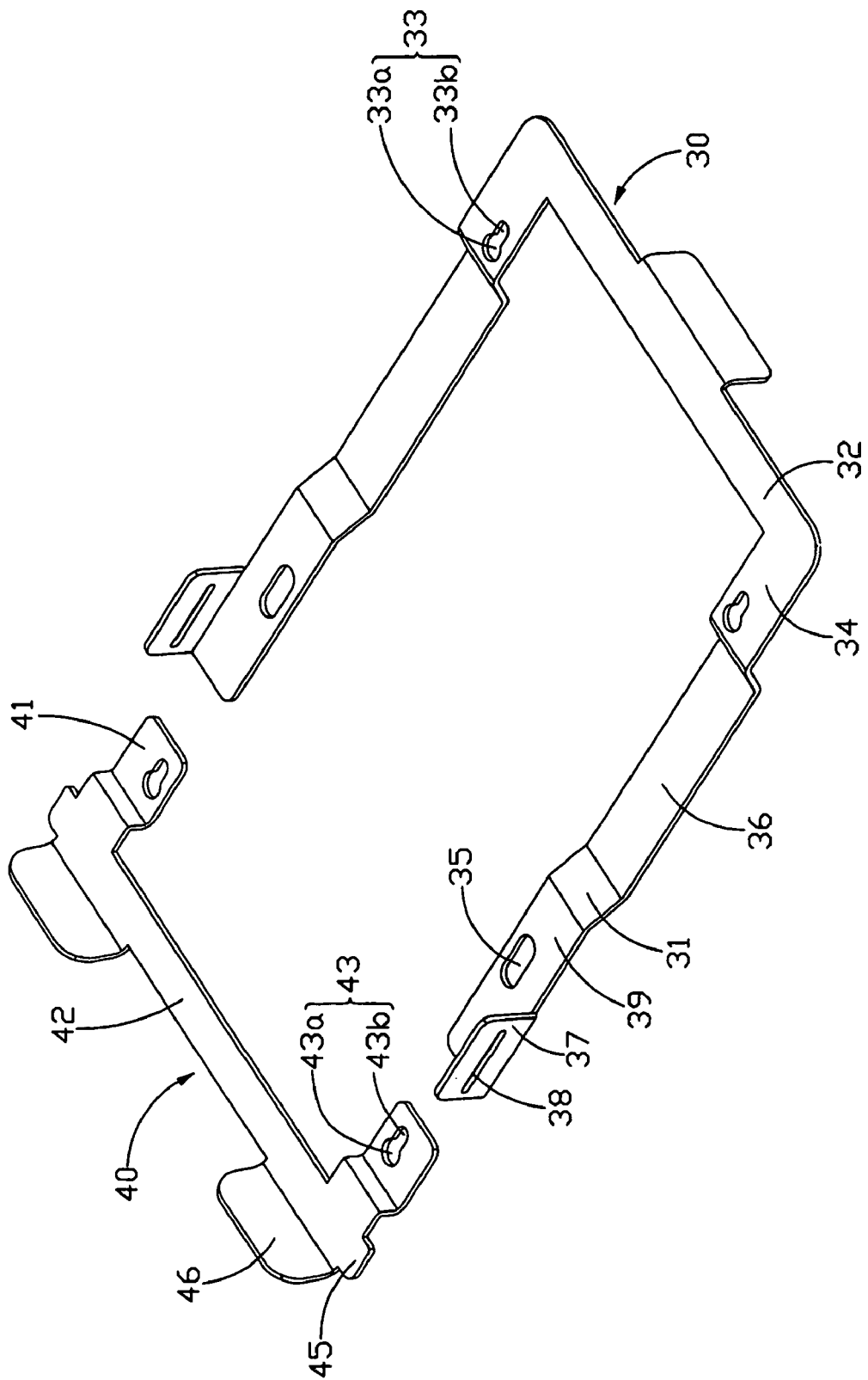
FIG. 2 is an exploded view of a retention member of the heat dissipation device assembly of FIG. 1.

Referring also to FIG. 2, the pressing part 30 comprises a pair of arms (not labeled) and a connecting bar 32 connected between ends of the arms to define a U-shape. Each arm comprises a central pressing portion 36, a pair of extension portions 31 extending from opposite ends of the pressing portion 36, a locking portion 34 extending from one extension portion 31, and a connecting portion 39 extending from the other extension portion 31. The connecting bar 32 is connected between the locking portions 34 of the arms. The locking portions 34 each define a locking opening 33. The locking opening 33 comprises a guiding entrance 33a and a locking slot 33b in communication with the entrance 33a. The connecting portions 39 each define an elongated through opening 35. A pair of tabs 37 extend upwardly from the connecting portions 39 opposing the connecting bar 32. Each tab 37 defines a slot 38.

The sliding part 40 comprises an elongated body 42 and a pair of locking portions 41 extending from opposite ends of a side edge of the body 42 in directions perpendicular to the body 42. Each locking portion 41 defines a locking opening 43 similar to the locking openings 33 of the pressing part 30. The locking opening 43 also comprises a guiding entrance 43a and a locking slot 43b. A pair of tongues 45 is formed in opposite ends of the body 42 for being received in the slots 38 of the pressing part 30. A pair of handles 46 extends upwardly from opposite ends of an opposite side edge of the body 42. In assembly of the retention member, the locking portions 41 of the sliding part 40 are placed on the connecting portions 39 of the pressing part 30. The tongues 45 of the sliding part 40 are received in the slots 38 of the pressing part 30.

Figure 3:
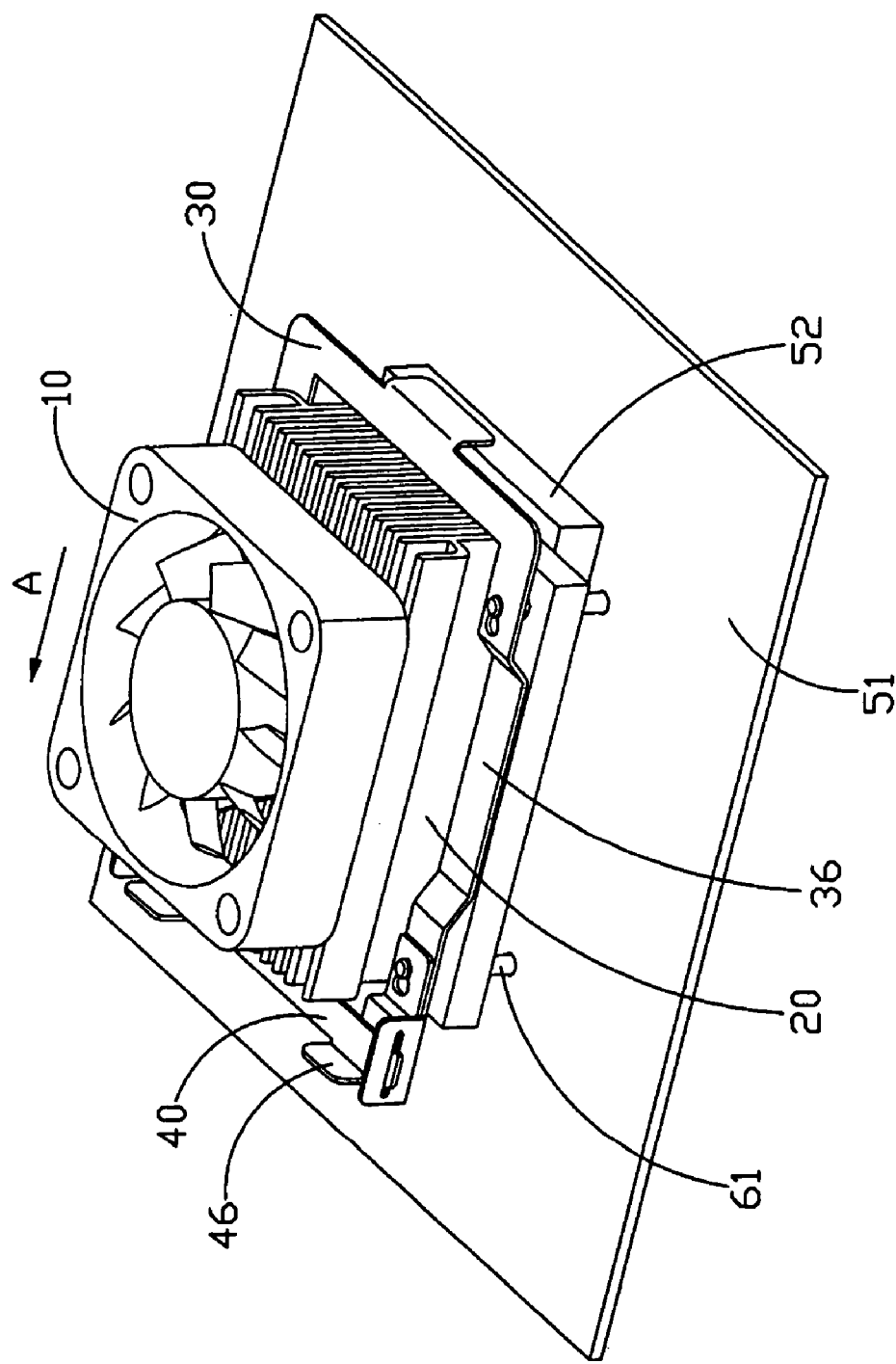
FIG. 3 is an assembled view of FIG. 1.
Figure 4:
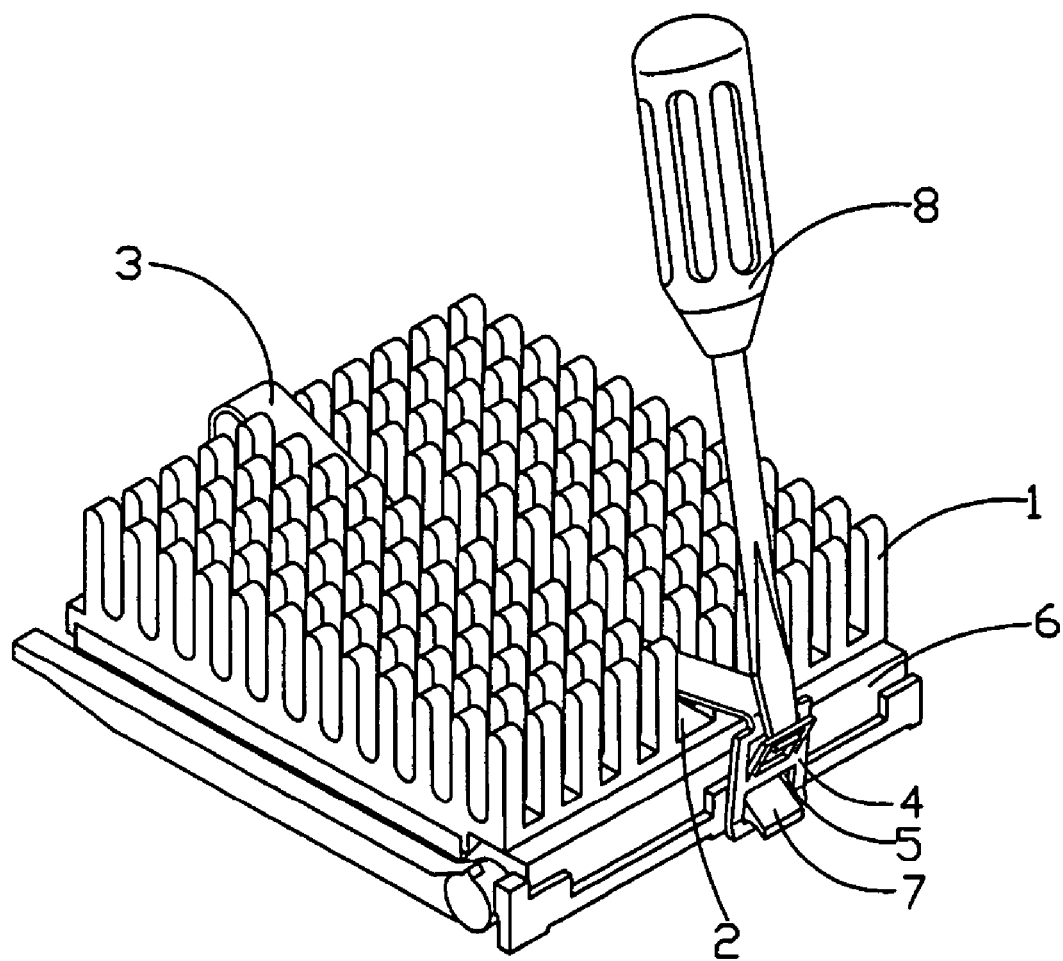
FIG. 4 shows a conventional clip mounting a heat sink to a socket.

Referring to FIG. 3, in assembly, the fan 10 is mounted on the heat sink 20. The combined fan 10 and heat sink 20 is mounted on the electronic component 52 with the through apertures 24 of the heat sink 20 aligned with the respective through apertures 53 of the PCB 50. The retention member is placed on the heat sink 20 with the pressing portions 36 of the pressing part 30 supported on the shoulders 23 of the heat sink 20 and the entrances 33a, 43a of the retention member aligned with the through apertures 24, 53 respectively. The pressing part 30 and the sliding part 40 cooperatively surround the fins 22. The back plate 60 is then attached below the PCB 50 with the posts 61 sequentially extending through the through apertures 53, 24. The locking portions 34 of the pressing part 30 are downwardly pressed to allow one pair of the posts 61 to extend through the entrances 33a of the pressing part 30 and then moved in a direction as arrow A shown. The necks 64 of said pair of posts 61 are therefore engaged with the pressing part 30 in the locking slots 33b. In the same way, the sliding part 40 is downwardly pressed to allow the other pair of the posts 61 to extend through the through openings 35 of the pressing part 30 and the entrances 43a of the locking openings 43 and then moved in the direction as arrow A shown by operation on the handles 46. The necks 64 of said the other pair of posts 61 are therefore engaged with the sliding part 40 in the locking slots 43b. The pressing part 30 is deformed and the pressing portions 36 of the pressing part 30 press the heat sink 20 toward the electronic component 52 to cause the base 21 of the heat sink 20 to intimately contact the electronic component 52.

In the present invention, the retention member occupies small space. Furthermore, no tool is required to operate the retention member. Another advantage of the instant invention is to provide a separate and independent engagement between the post 61 and the corresponding locking slot 33b, 43b.

It is understood that the invention may be embodied in other forms without departing from the spirit thereof. Thus, the present example and embodiment is to be considered in all respects as illustrative and not restrictive, and the invention is not to be limited to the details given herein. For example, alternately the locking opening 43 can be reversely arranged so that the sliding part 40 is horizontally moved inward to lock the whole assembly instead of outwardly moving. Under this situation, the associated pressing part 30 and sliding part 40 are commonly initially downwardly moved with a larger opening to surround the heat sink 20 under a first condition that the post 61 is loosely located in the guiding entrance (33a, 43a), and successively moved toward each other to form a smaller opening for snugly complying the exterior dimension of the heat sink 20 under a condition that the post 62 is tightly located in the locking slot (33b, 43b).

What is claimed is:

1. A combination comprising:
   a printed circuit board with an electronic component mounted thereon;
   a heat sink mounted on the electronic component, a pair of shoulders being provided on opposite sides of the heat sink;
   a retention member comprising a pair of pressing portions supported on the shoulders, and a pair of locking portions on opposite sides of each pressing portion, the locking portions spaced from the shoulders, each locking portion defining a locking opening therein; and
   a back plate mounted below the printed circuit board, the back plate comprising two pairs of posts extending through the printed circuit board and the heat sink to engage with the retention member in the locking openings;
   wherein the heat sink comprises a plurality of fins between the shoulders and the retention member surrounds the fins, and wherein the retention member comprises a pressing part in which the pressing portions are formed and a sliding part movably attached to the pressing part.

2. The combination as claimed in claim 1, wherein the pressing part is substantially U-shaped and comprises a pair of arms and a connecting bar, each arm comprising one of the pressing portions and one of the locking portions, the connecting bar being connected between the locking portions of the arms.

3. The combination as claimed in claim 2, wherein each arm further comprises a connecting portion opposing the locking portion thereof, and the sliding part comprises an elongated body, the other two of the locking portions extending perpendicularly from opposite end portions of the body and lying on the connecting portions of the arms, respectively.

4. The combination as claimed in claim 3, wherein a tab defining a slot is formed upwardly from each connecting portion of the arms, and the body of the sliding part forms a pair of tongues on opposite ends thereof, the tongues being slidably received in the slots respectively.

5. The combination as claimed in claim 1, wherein the locking opening comprises an entrance for extension of a corresponding post and a locking slot in communication with the entrance for engaging with the corresponding post.

6. The combination as claimed in claim 5, wherein each post comprises a head and a neck below the head, the neck engaging with a corresponding locking portion in the locking slot.

7. An electronic device assembly comprising:
   a printed circuit board with an electronic component mounted thereon,
   a heat sink mounted on the electronic component, a pair of shoulders being provided on opposite sides of the heat sink;
   a pressing part comprising a pair of pressing portions supported on the shoulders of the heat sink, and a pair of locking portions spaced from the shoulders;
   a sliding part slidably attached to the pressing member, the sliding member comprising a pair of locking portions spaced from the shoulder; and
   a back plate mounted below the printed circuit board, the back plate comprising two pairs of posts extending through the printed circuit board and the heat sink to resilently engage with the locking portions,
   wherein the pressing member and the sliding member surround the heat sink.

8. The electronic device assembly as claimed in claim 7, wherein the pressing part is substantially U-shaped.

9. The electronic device assembly as claimed in claim 8, wherein the pressing part further comprises a pair of connecting portions opposing the locking portions thereof, and the sliding part comprises an elongated body, the locking portions of the sliding part extending perpendicularly from opposite end portions of the body and supported on the connecting portions of the pressing part, respectively.

10. The electronic device assembly as claimed in claim 7, wherein each locking portion defines a locking opening comprising an entrance and a locking slot in communication with the entrance, the post being capable of extending through the entrance to engage in the locking slot of a corresponding locking opening.

11. The electronic device assembly as chimed in claim 7, further comprising a fan mounted on the heat sink.

12. The electronic device assembly as claimed in claim 7, wherein the heat sink comprises a base and a plurality of fins extending from the base, the shoulders being formed in the base on opposite sides of the fins.

13. A combination comprising:
a printed circuit board with an electronic component located thereon;
a heat sink seated on the electronic component;
a retention member seated upon the heat sink and comprising first and second associated pressing parts horizontally moveable while vertical immoveable relative to each other, first and second locking openings formed in said first and second pressing parts, respectively; and
first and second posts upwardly extending above the printed circuit board with first and second locking heads at top ends, respectively; wherein
the retention member is initially downwardly moved toward the printed circuit board with the first and second locking heads of the first and second posts extending through first and second entrances of the corresponding first and second locking openings, respectively, in a free loose manner with regard to a relative vertical movement, and successively moved horizontally with the first and second locking heads of the first ands second posts latchably received in first and second locking slots of the corresponding first and second locking openings, respectively, in a locked tight manner with regard to the relative vertical movement.

14. The combination as claimed in claim 13, where engagement/disengagement of the first locking head and the corresponding first locking opening is essentially independent from that of the second locking head and the corresponding second locking opening.

15. The combination as claimed in claim 13, wherein said first pressing part and said second pressing part moves along a same direction horizontally when the retention member is changed from the free loose manner to the locked tight manner.

16. The combination as claimed in claim 13, wherein said retention member defines a frame-like configuration with an opening surrounding the heat sink.

* * * * *